United States Patent
Ang et al.

(10) Patent No.: US 8,569,676 B2
(45) Date of Patent: Oct. 29, 2013

(54) POWER GRID ABUTTING A PHOTORECEPTOR ELEMENT AND HAVING A BREAK IN A GEOMETRIC LOCATION TO SHIFT POWER FLOW OF THE GRID

(75) Inventors: Lin Ping Ang, Chino Hills, CA (US); Steven Huang, Arcadia, CA (US)

(73) Assignee: Forza Silicon Corporation, Pasadena, CA (US)

( * ) Notice: Subject to any disclaimer, the term of this patent is extended or adjusted under 35 U.S.C. 154(b) by 0 days.

(21) Appl. No.: 13/435,457

(22) Filed: Mar. 30, 2012

(65) Prior Publication Data

US 2012/0181649 A1  Jul. 19, 2012

Related U.S. Application Data

(63) Continuation of application No. 11/624,095, filed on Jan. 17, 2007, now Pat. No. 8,263,924.

(51) Int. Cl.
*G01J 1/44* (2006.01)
*H01L 27/146* (2006.01)

(52) U.S. Cl.
USPC ...................................... 250/214 R; 257/443

(58) Field of Classification Search
USPC ............... 250/208.1, 214 R, 208.2, 216, 239, 250/237 R, 229, 214.1; 257/431, 432, 443, 257/444, 290, 257, 258, 291, 435, 457; 348/272, 294, 332, 25, 302, 303; 345/55, 58, 84; 382/260, 206
See application file for complete search history.

(56) References Cited

U.S. PATENT DOCUMENTS

| | | | |
|---|---|---|---|
| 5,331,179 A | 7/1994 | Lee et al. | |
| 5,440,079 A | 8/1995 | Mathur et al. | |
| 6,357,302 B1 * | 3/2002 | Knapp | 73/862.626 |
| 6,396,118 B1 | 5/2002 | Thell et al. | |
| 2002/0148967 A1 | 10/2002 | Iwanczyk et al. | |
| 2007/0187787 A1 * | 8/2007 | Ackerson et al. | 257/428 |

* cited by examiner

*Primary Examiner* — Que T Le
*Assistant Examiner* — Jennifer Bennett
(74) *Attorney, Agent, or Firm* — Law Office of Scott C. Harris, Inc.

(57) ABSTRACT

A chip device with a number of individually powered parts, such as photoreceptors. A mesh is provided to provide power to the individual photoreceptors. The mesh may be provided for ground and power and/or both. The mesh may be on different layers, so that one portion of the mesh is exactly over the other portion of the mesh. The mesh takes up a portion of real estate on the chip in between the individual photoreceptors, in locations where image sensing parts cannot be located. In an embodiment, the mesh can be intentionally broken at various locations to optimize the path length.

8 Claims, 3 Drawing Sheets

POWER GRID ABUTTING A PHOTORECEPTOR ELEMENT AND HAVING A BREAK IN A GEOMETRIC LOCATION TO SHIFT POWER FLOW OF THE GRID

CROSS-REFERENCE

This application is a Continuation of Ser. No. 11/624,095 filed Jan. 17, 2007, the disclosure of the parent application is incorporated herein by reference, in its entirety.

BACKGROUND

Image sensors include a number of picture elements or pixels. Each pixel obtains one portion of a final acquired image. The pixels are in different physical locations on the semiconductor substrate chip that forms the image sensor. Each of the pixels includes a circuit that individually obtains a portion of the image. Hence, each of these pixel circuits must receive power.

The power is typically applied from the outside of the chip, and shuttled across the chip to each of the pixels. As the power is delivered across the chip, each area over which the power passes effectively forms a resistance. The resistance leads to a voltage drop. Therefore, power delivered to portions which are further away from the spot where the power is sourced may have a lower voltage, as compared with other portions which are closer to the edge of the chip.

It is important to supply consistent amounts of power throughout the whole chip. Any variation in the supply power, e.g., the voltage across the chip, may produce effects in the final image which is obtained by the chip. For example, a pixel circuit which receives a slightly lower voltage may show up as slightly brighter than other pixels or slightly less bright than other pixels. Since this variation will be consistent from frame to frame, the change may be very noticeable.

As the image sensor chips become larger, it becomes more difficult to maintain a constant voltage everywhere on the chip. For example, chips which have 2000-3000 columns may have a voltage drop across the extent of the chip.

Conventionally, a relatively large diameter power supply line is run to attempt to minimize the effects of the voltage drop.

BRIEF DESCRIPTION OF THE DRAWINGS

These and other aspects will now be described in detail with reference to the accompanying drawings.

SUMMARY

The present application describes forming a ground and power mesh that extends across the chip to multiple areas of the chip. This may have the effect of reducing the resistance to the different areas.

According to one embodiment, the mesh extends around each and every pixel circuit area.

According to another embodiment, the mesh extends around groups of pixels.

One embodiment intentionally forms openings in the mesh to tailor the voltage drop across the chip.

DETAILED DESCRIPTION

The inventors recognized issues with the current way that power is delivered to an image sensor chip. Since the power delivery may use a large piece of metal, this may take up valuable real estate on the chip, and also increase the chip formation complexity and weight. Also, it may be important to maintain symmetry on the chip, and the large pieces of metal used for power and ground distribution may reduce that symmetry.

In addition, the inventors recognize that when a single path of wiring is used to transmit either power or ground, a single piece failure will cause catastrophic failure of the entire chip.

Figure 1:
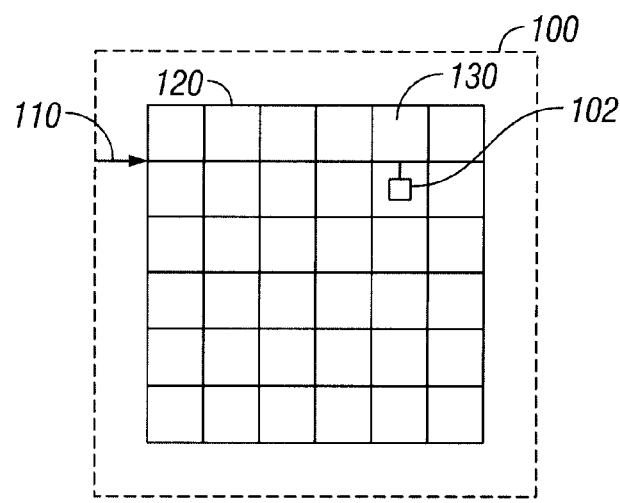
FIG. 1 shows an image sensor chip.
Figure 2:
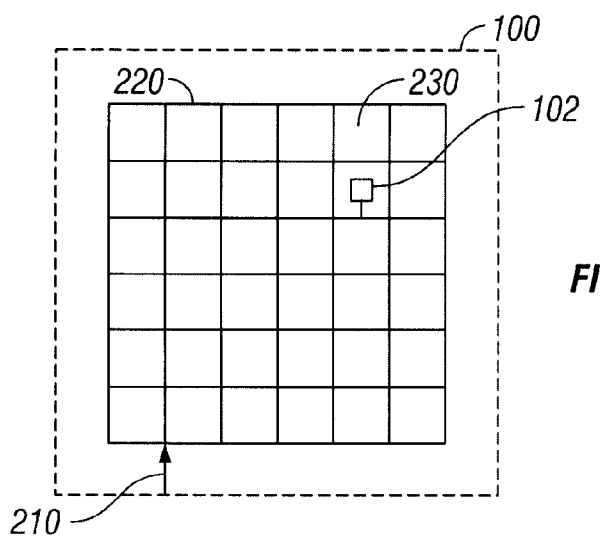
FIG. 2 illustrates a different level of the chip shown in FIG. 1.
Figure 3:
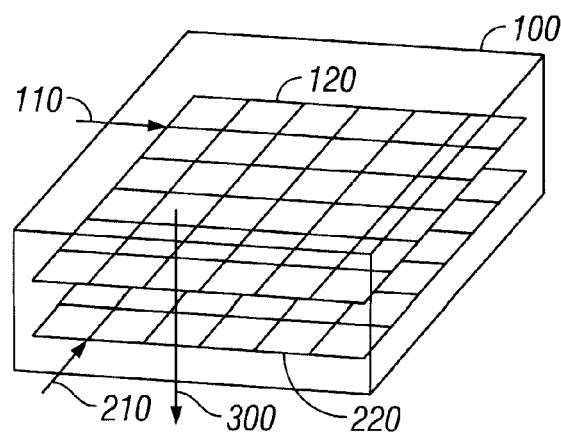
FIG. 3 illustrates the power and ground grids.

An embodiment is shown in FIGS. 1 through 3. FIG. 1 shows an image sensor chip 100 which includes a plurality of image sensor pixels, such as 102, formed thereon. Each image sensor pixel 102 includes a photoreceptor, e.g., a photodiode, and control and processing circuitry. In an embodiment, the pixels may be active pixel sensors.

Each pixel receives power. The power is applied from the edge of the chip, here from the location 110. It may be conventional to provide power from one edge of the chip, over multiple different pins. The power is applied to a grid structure 120. The grid structure 120 extends in two orthogonal directions forming a grid over the entire chip. The grid forms a number of apertures 130, each aperture extending between two parallel left-to-right running portions of the grid, and two parallel top-to-bottom portions of the grid. FIG. 1 labels only one of the apertures 130, but it should be seen that there can be many of these apertures.

FIG. 1 shows the grid for the power. FIG. 2 illustrates a different level of the chip which includes a grid portion for ground. The ground connection 210 is applied to a different edge of the chip than the power connection. However, the ground connection similarly connects to a grid structure 220, having a plurality of lines extending in orthogonal directions forming a plurality of apertures such as 230 in between each adjacent pair of portions. Again, the pixel 102 is shown within one of the apertures, connected to the ground portion.

FIG. 3 illustrates the power and ground grids and how they fit on different layers of the integrated circuit. The power grid 120 and its connection 110 are shown on one layer of the integrated circuit 100. The ground connection 210, and its associated ground grid 220 are shown on a completely different layer, below the first layer.

According to an embodiment, a hypothetical axis such as 300 which extends perpendicularly from the top to the bottom, passes through both a portion of the power grid 120 in the corresponding portion of the ground grid 220. That is, since the power grid and the ground grid are aligned with one right over the other, it forms an inherent decoupling between power and ground. Moreover, there is an inherent yield improvement from this system, since a single point break will not cause piece failures.

The embodiment shows the power being on top of ground, but of course it can be completely reversed, whereby the ground grid is on top and the power grid is underneath.

Figure 4:
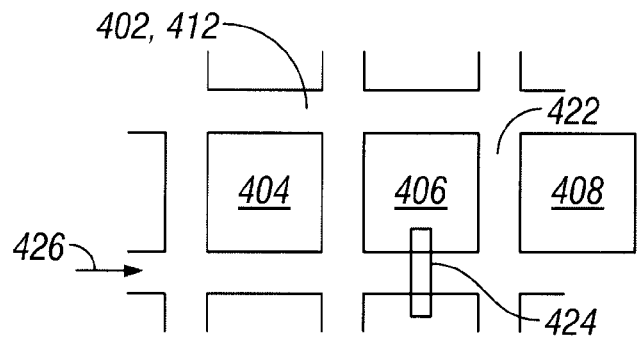
FIG. 4 illustrates an every single row embodiment.

Different embodiments may form different sized grids for the power. FIG. 4 illustrates an every single row embodiment. In the FIG. 4 embodiment, the power grid shown as 402, 412 surrounds each and every pixel. Therefore, a pixel 406 and a pixel 408 each are each completely surrounded by the corresponding power grid. Similarly, since the ground grid (which cannot be seen in the view of FIG. 4) is entirely collinear with the power grid, the ground grid similarly surrounds each pixel.

FIG. 4 illustrates the grids as being 402 and 412, where 402 is the power grid and 412 is the ground grid. These grids may be on different levels. In addition, the image sensor circuitry such as 408 may also be on a different chip level than the grids. 426 shows the power applied to the grid. Preferably, the grids are located in areas between the pixels. For example, the portion of the grid labeled as 422 is between pixel portions 406 and 408. Therefore, by constraining the thickness of the grid elements to the necessary space between pixels, the amount of real estate taken up by the system may be minimized.

Another advantage is provided from the fact that any one breakage at any one location will not cause failure of the overall chip. For example, if there were a breakage at the location 424 in FIG. 4, power would still be supplied to chip 408, just not by the shortest possible route.

Figure 5:
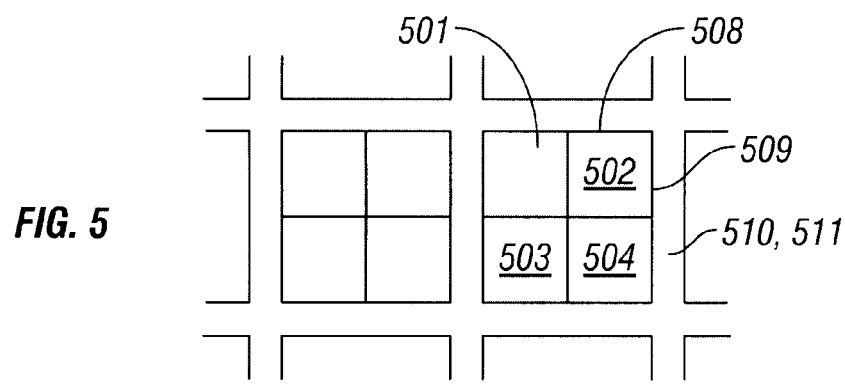
FIG. 5 illustrates another embodiment in which each group of pixels are surrounded by mesh elements.

FIG. 5 illustrates another embodiment, in which each group of pixels (here 4 pixels) are surrounded by mesh elements. In the FIG. 5 embodiment, five individual pixel elements 501, 502, 503, 504 form a 4.times.4 neighborhood that is surrounded by meshed portions 510, 511 (respectively for power and ground). The groups of pixels each directly abut against one of the grid portions. For example, each pixel in the group has two walls that abut against the grid portion. Therefore, the pixel 502 has two walls 508, 509 that are directly against the grid portions and can receive power and ground therefrom.

In a similar way, any n.times.n group of pixels can receive powering ground. For a 3.times.3 group of pixels, the center pixel will not abut against the grid directly, but will have only one pixel width of spacing. For a 4.times.4 group of pixels, there may be 2 pixels of difference. It is believed that any n.times.n group of pixels up to n=20 may still obtain significant advantages from this system.

Figure 6:
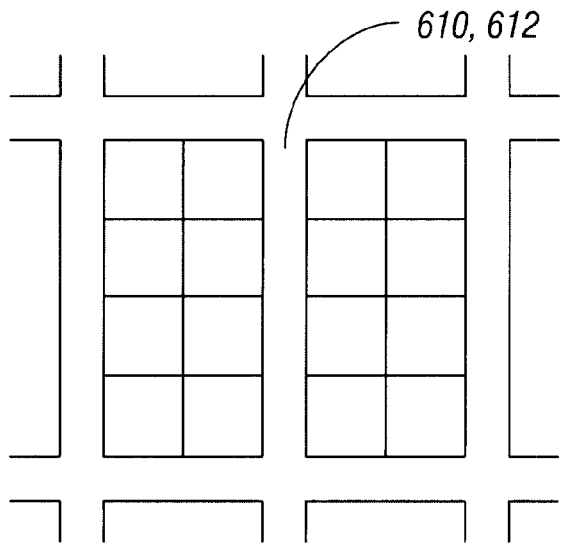
FIG. 6 shows another embodiment which may surround a symmetrical group of pixels.

Another embodiment may surround an asymmetrical group of pixels, for example a 2.times.n group of pixels. Each of the 2.times.8 groups of pixels, as shown in FIG. 6, is surrounded by mesh portions 610, 612. Note that in the 2.times.n embodiment, each pixel of each group still abuts against both power and ground. In the 3.times.n embodiment, there are a few pixels that do not directly abut against the grid. However, any subset may be used in this way.

The mesh may surround a group of pixels, or any subset thereof. It can surround, for example, every 2.times.2 group of pixels, every 3.times.3 group of pixels, every 2.times.3 group of pixels, for any other subset.

Figure 7:
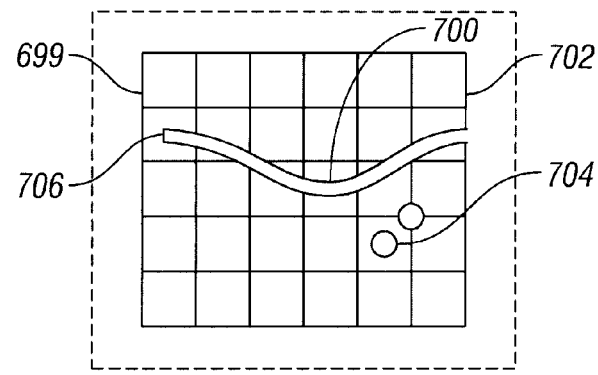
FIG. 7 shows another embodiment which includes intentional break areas.

Another embodiment is shown in FIG. 7. This embodiment includes intentional break areas shown as 700, along the mesh 699. The break area 700 is placed at locations to equalize power to areas of the mesh. In the embodiment of FIG. 7, power is applied at the area 702. Therefore, a pixel area such as 704 would be very close to the power. The power would simply have to travel from the application 702 in a straight line to 704. Note that the power would have to travel much further to 706. While the mesh reduces the resistance across the chip, it does not succeed in reducing it all the way to zero. Accordingly, there is still some voltage drop across the chip, albeit less. However, the intentional break in the mesh can cause the power to travel a longer distance, from the application 704, all the way around the edge of the break 706, and finally to the pixel 704.

The geometric location of break 700 may be varied across the mesh, relative to the location where power is applied. The basic idea is that the break in the mesh will change the path that the power follows, thereby forcing the power along an alternative path which is longer than the minimum distance. For example, pixel areas such as 704 do not receive power in a straight line from the spot 702, but rather receive it after having traveled around the mesh.

The geometric location of the break may be mathematically determined, for example using chip layout software. In one embodiment, the geometric location of the break may be optimized by setting a distance between power (or ground) and each photodetector element, setting these as variables, and running a routine that minimizes the variance and length of all sets variables.

Figure 8:
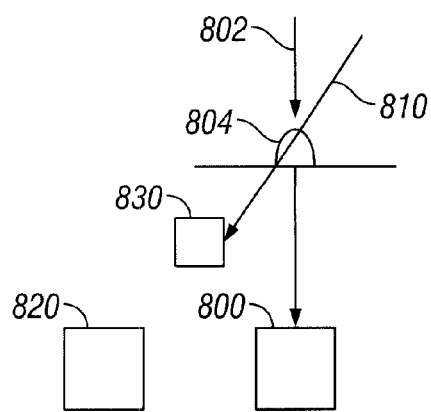
FIG. 8 illustrates an exemplary chip layout in cross section.
Figure 9:
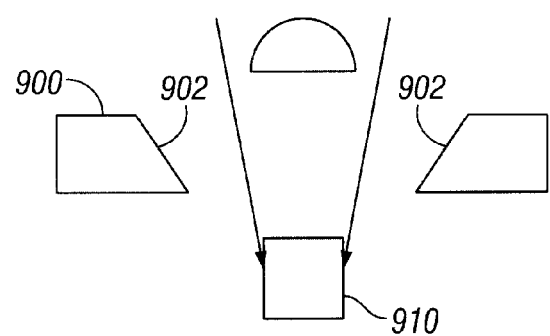
FIG. 9 shows another feature wherein the mesh is located surrounding the pixel.

Another aspect defines placing the metal mesh that surrounds the photodiodes or groups of photodiodes, to carry out another purpose unrelated to the power consumption. Two embodiments are shown in FIGS. 8 and 9 respectively. The first embodiment may place the metal in a specific location where it can reduce optical cross talk between the pixels. FIG. 8 illustrates an exemplary chip layout in cross section. A pixel photoreceptor 800 is intended to receive incoming light rays 802 which pass through a lens 804 and are passed directly to the pixel 800.

A ray of light which comes in from an angle, such as ray 810, could normally be passed to the wrong pixel. For example, normally ray 810 might be passed to pixel 820, which will cause a ray to be picked up by the wrong pixel. This is called optical cross talk. In this embodiment, at least a portion of the mesh 830 is located at a layer and at a location where it will prevent at least one item of optical crosstalk.

Note that the ray 810 is blocked by the position of the mesh 830. Since the mesh completely surrounds the pixel 800, it forms, in essence, a cone of optical cross talk prevention.

Another feature is shown in FIG. 9. The mesh 900 is located surrounding the pixel 910. In this embodiment, the mesh is formed with sloped edges 902 which, in essence, funnel the light towards the pixel.

Although only a few embodiments have been disclosed in detail above, other embodiments are possible and the inventor(s) intend these to be encompassed within this specification. The specification describes specific examples to accomplish a more general goal that may be accomplished in another way. This disclosure is intended to be exemplary, and the claims are intended to cover any modification or alternative which might be predictable to a person having ordinary skill in the art. For example, other devices can be included in a chip of this type. The grid can be of any shape, and is not limited to the symmetrical, orthogonal shape shown and described in the specification.

Also, the inventor(s) intend that only those claims which use the words "means for" are intended to be interpreted under 35 USC 112, sixth paragraph. Moreover, no limitations from the specification are intended to be read into any claims, unless those limitations are expressly included in the claims.

The computers described herein (such as for path length optimization or for controlling operation of the multiple pixels of the image sensor) may be any kind of computer, either general purpose, or some specific purpose computer such as a workstation. The computer may be a Pentium class computer, running Windows XP or Linux, or may be a Macintosh computer. The computer may also be a handheld computer, such as a PDA, cellphone, or laptop.

The programs may be written in C, or Java, Brew or any other programming language. The programs may be resident on a storage medium, e.g., magnetic or optical, e.g. the computer hard drive, a removable disk or media such as a memory stick or SD media, or other removable medium. The programs may also be run over a network, for example, with a server or other machine sending signals to the local machine, which allows the local machine to carry out the operations described herein.

Where a specific numerical value is mentioned herein, it should be considered that the value may be increased or decreased by 20%, while still staying within the teachings of the present application, unless some different range is specifically mentioned.

What is claimed is:

1. An integrated circuit chip comprising:
a plurality of individual photoreceptor elements, each said photoreceptor element operating to obtain independent image data, said plurality of individual photoreceptor elements located in an array at different areas covering a surface of the chip; and
a power grid, having a first power connecting portion, which is adapted to be attached to a source of power, and having a first plurality of parallel elements, and a second plurality of parallel elements, which extend substantially orthogonal to said first plurality of elements and are connected to said first plurality of parallel elements, said first and second parallel elements forming box shaped structures between said first plurality of parallel elements and said second plurality of parallel elements;
said plurality of individual photoreceptor elements arranged such that at least one side of each of said photoreceptor elements abuts against another photoreceptor element, and at least one other side of each said individual photoreceptor elements abuts directly against said power grid, and receives power directly from said power grid,
said power grid having a break in the power grid, forming a location where power can pass around the break, but power cannot pass directly across the break, where a geometric location of the break is set to force at least some of said individual photoreceptor elements to require power to flow through a longer than optimal path from a power source to the photoreceptor element.

2. The integrated circuit as in claim 1, wherein said photoreceptor elements are arranged in groups of four, each four photoreceptor elements being surrounded by one of said boxes of said power grid, providing power to two sides of each photoreceptor elements within said box.

3. The integrated circuit as in claim 1, wherein said photoreceptor elements are arranged in groups of six, each six photoreceptor elements being surrounded by one box of said power grid.

4. The integrated circuit as in claim 1 wherein said chip having multiple different levels, said power grid forms said boxes across a first area on the same level as a first level of said individual photoreceptor elements, and further comprising a ground grid on a different level from said first level, also forming boxes, wherein said boxes of said ground grid are collinear with boxes of said power grid.

5. The integrated circuit as in claim 1, wherein the location of the break is set to equalize a distance that power passes to each of a plurality of different pixels.

6. The integrated circuit as in claim 1, wherein the chip has multiple levels, and the power grid is on a different level than the photoreceptor elements.

7. The integrated circuit as in claim 1, further comprising locating at least a portion of the power grid in a location where it will reduce optical crosstalk.

8. The integrated circuit as in claim 1, further comprising locating at least a portion of the power grid in a location to funnel light towards the photoreceptor elements.

* * * * *